(12) United States Patent
Boomhower (10) Patent No.: US 10,183,467 B2
(45) Date of Patent: Jan. 22, 2019

(54) ENCAPSULATED BEAM AND METHOD OF FORMING

(71) Applicant: General Electric Company, Schenectady, NY (US)

(72) Inventor: Oliver Charles Boomhower, Waterford, NY (US)

(73) Assignee: GENERAL ELECTRIC COMPANY, Schenectady, NY (US)

( * ) Notice: Subject to any disclaimer, the term of this patent is extended or adjusted under 35 U.S.C. 154(b) by 604 days.

(21) Appl. No.: 14/798,837

(22) Filed: Jul. 14, 2015

(65) Prior Publication Data

US 2015/0314570 A1 Nov. 5, 2015

Related U.S. Application Data

(63) Continuation of application No. 13/533,192, filed on Jun. 26, 2012, now Pat. No. 9,102,119.

(51) Int. Cl.
*B32B 15/01* (2006.01)
*C25D 7/00* (2006.01)
(Continued)

(52) U.S. Cl.
CPC .............. *B32B 15/018* (2013.01); *B05D 1/38* (2013.01); *B32B 9/00* (2013.01); *C22C 5/02* (2013.01); *C22C 19/03* (2013.01); *C25D 7/00* (2013.01); *G03F 7/00* (2013.01); *G03F 7/0035* (2013.01); *Y10T 428/12889* (2015.01); *Y10T 428/239* (2015.01)

(58) Field of Classification Search
CPC ...................................... B32B 15/01

USPC .......................................... 428/656
See application file for complete search history.

(56) References Cited

U.S. PATENT DOCUMENTS 3,760,238 A 9/1973 Hamer et al.
4,620,761 A * 11/1986 Smith .................. H05K 7/1069
439/372
(Continued)

FOREIGN PATENT DOCUMENTS

WO 2003081725 A2 10/2003

OTHER PUBLICATIONS

Armstrong et al., "Nanoindentation and micro-mechanical fracture toughness of electrodeposited nanocrystalline Ni—W alloy films", Feb. 15, 2012, Thin Solid Films 520, pp. 4369-4372.*

(Continued)

*Primary Examiner* — Humera N Sheikh
*Assistant Examiner* — Xiaobei Wang
(74) *Attorney, Agent, or Firm* — GE Global Patent Operation; John Darling (57) ABSTRACT

A device including a protecting material encapsulated metallic beam and a method of encapsulating the metallic beam using the protecting material layer are presented. The device includes a cantilever beam that includes at least about 90 Wt % of a metallic beam material, and 10 Wt % or less of a protecting material. The method of forming an encapsulated metallic beam includes the steps of depositing a first layer of protecting material over a substrate, depositing a second layer of protecting material over the first layer, depositing a metallic beam material over the second layer of protecting material, and encapsulating the beam material with a coating of the protecting material.

15 Claims, 6 Drawing Sheets

(51) Int. Cl.
  *G03F 7/00*  (2006.01)
  *B05D 1/38*  (2006.01)
  *C22C 19/03*  (2006.01)
  *C22C 5/02*  (2006.01)
  *B32B 9/00*  (2006.01)

(56) References Cited

U.S. PATENT DOCUMENTS

| | | | |
|---|---|---|---|
| 6,800,503 B2 * | 10/2004 | Kocis | B81C 1/00666 |
| | | | 257/214 |
| 6,872,902 B2 | 3/2005 | Cohn et al. | |
| 7,018,857 B2 | 3/2006 | Kanamaru et al. | |
| 7,095,822 B1 | 8/2006 | Yun | |
| 7,142,000 B2 | 11/2006 | Eldridge et al. | |
| 7,323,634 B2 | 1/2008 | Speakman | |
| 7,708,372 B2 | 5/2010 | Silverbrook | |
| 8,107,777 B2 | 1/2012 | Farah | |
| 2003/0230798 A1 | 12/2003 | Lin et al. | |
| 2008/0105937 A1 | 5/2008 | Bar-Sadeh et al. | |
| 2010/0019349 A1 | 1/2010 | Oladeji et al. | |
| 2010/0110518 A1 | 5/2010 | Wu et al. | |
| 2010/0127727 A1 | 5/2010 | Heck | |

OTHER PUBLICATIONS

Sandberg et al., "Effect of gold coating on the Q-factor of a resonant cantilever", Oct. 28, 2005, J. Micromech. MicroEng. 15, pp. 2249-2253.*

Ionascu et al., "Aspects of Silicon Mems Cantilever Beams Micromachining", The Romanian Review Precision Mechanics, Optics & Mecatronics, 2008 (18), No. 34, pp. 169-172.

* cited by examiner

ENCAPSULATED BEAM AND METHOD OF FORMING

CROSS REFERENCE TO RELATED APPLICATIONS

This application is a continuation of U.S. patent application Ser. No. 13/533,192, titled "ENCAPSULATED BEAM AND METHOD OF FORMING," filed on 26 Jun. 2012.

BACKGROUND

This invention relates generally to an encapsulated beam and method of encapsulating the beam. Particularly the invention relates to a device including a protecting material encapsulated metallic beam and method of encapsulating the metallic beam using the protecting material layer.

Microelectromechanical systems (MEMS) are electromechanical devices that generally range in size from a micrometer to a millimeter in a miniature sealed package. A MEMS device in the form of a microswitch has a movable electrode called a beam that is moved toward a stationary electrical contact by the influence of a gate electrode positioned near the beam. The movable electrode may be a flexible beam that bends under applied forces such as electrostatic attraction, magnetic attraction and repulsion, thermally induced mismatch that closes a gap between a free portion of the beam and the stationary contact. One form of a movable flexible beam is a cantilever beam. In another form the movable beam is fixed at two ends.

Introduction of contaminants such as moisture, particulates, or oxygen into the area surrounding the device can cause sticking, contamination, or interference of the metal contacts, leading to device failure. MEMS cantilever beams are often manufactured during the MEMS device formation by depositing the beam material and then releasing the beam material by dicing or etching out the layer below the beam structure. This dicing or etching procedure during manufacturing may lead to the device degradation during operation.

Therefore, methods of protecting the beam structure from attack and degradation during release and operation, preventing the device failure by particle generation and/or performance alteration are needed.

BRIEF DESCRIPTION

Embodiments of the present invention address these and other needs. Briefly, in one embodiment, a method is disclosed. The method includes the steps of depositing a first layer of protecting material over a sacrificial layer, depositing a second layer of protecting material over the first layer of protecting material, depositing a metallic beam material over the second layer of protecting material, and encapsulating the beam material with a coating of the protecting material.

In one embodiment, a method is disclosed. The method includes the steps of depositing a sacrificial layer over a substrate, depositing a first layer of protecting material over the sacrificial layer, coating the first layer of protecting material with a dielectric layer, depositing a photoresist layer over the dielectric layer, patterning the photoresist layer, etching the dielectric layer to form an exposed region of the first layer of protecting material, depositing a second layer of the protecting material over the exposed region, depositing a metallic beam material over the second layer of protecting material, removing the photoresist layer to expose a lip of the second layer of protecting material, encapsulating the beam material by depositing the protecting material over the beam material and the lip, and removing at least a part of the sacrificial layer.

In one embodiment, a device is provided. The device includes a cantilever beam that includes at least about 90 Wt % of a metallic beam material, and 10 Wt % or less of a protecting material. The metallic beam material of the cantilever beam is encapsulated by the protecting material.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

One or more specific embodiments of the present invention will be described below. In an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

In the following specification and the claims that follow, the singular forms "a", "an" and "the" include plural referents unless the context clearly dictates otherwise.

Figure 1:
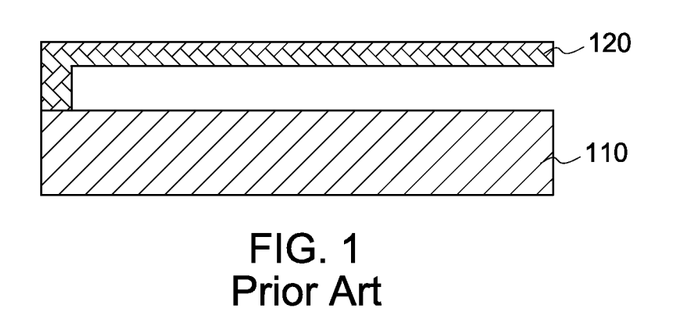
FIG. 1 illustrates a prior art device.

FIG. 1 schematically illustrates a prior art device 100. The device 100 includes a substrate 110, and a cantilever beam 120. Stiction of cantilever beams 120 normally occurs when the surface adhesion forces of the cantilever beam 120 with the substrate 110 are higher than the mechanical restoring forces of the cantilever beam 120. Stiction may happen during manufacturing and/or during operation of the device 100. Wet etching during release of the cantilever beam 120 from the substrate 110 may increase the surface adhesion force due to the hydrophilic pull of any aqueous solution used for etching. During operation, stiction may happen because of electrostatic forces, chemical bonding, or capillary forces, among others.

Figure 2:
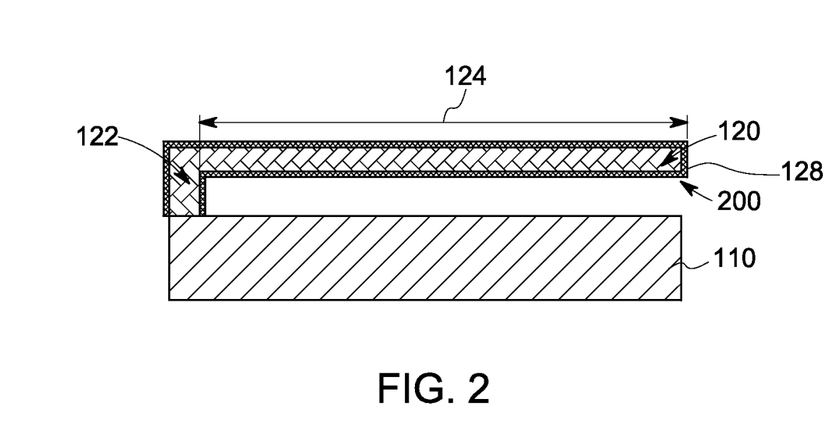
FIG. 2 illustrates a device, according to one embodiment of the present invention.

FIG. 2 schematically illustrates a device 100 per an embodiment of this invention. The device 100 includes a substrate 110, and a cantilever beam 120. The cantilever beam includes two regions: an anchor region 122 and a free portion 124. The anchor region 122 and the free portion 124 of the cantilever beam are identified separately for better explanation of the embodiments of this invention and this is not necessarily indicative of any structural or compositional differences between the two regions except that the anchor region 122 is physically connected to the substrate 110 and the free portion 124 is not physically connected to the substrate 110.

Further, the cantilever beam 120 includes two materials: a metallic beam material and a protecting material. As used herein the metallic beam material may include any material including a metallic phase. In one embodiment, the metallic beam material includes elemental metals, alloys, composites including any metallic element, or any combinations of these. Non limiting examples of the elemental metals or metallic elements include nickel, tin, platinum, silver, copper, and gold. The alloys include any combination of the aforementioned metallic elements or combinations of these metallic elements with any other metallic elements. In one embodiment, the alloys of the metallic beam material include nickel tungsten alloy, nickel iron alloy, gold alloy or any combinations of the foregoing. In one embodiment, the composite including a metallic element may have any other metals or ceramics as a part of the composite. In one embodiment, the composite of the metallic beam material includes more than 50 Wt % of a metallic element.

In one embodiment, the metallic beam material is in a monolithic form. As used herein, "metallic beam material is in a monolithic form" indicates that the metallic beam material is a single structure and does not include structural joints of the metallic beam material. As used herein the "joints" are the physical or chemical combination of two or more parts of the metallic beam material after an initial structure formation of the metallic beam material. A beam in the monolithic form does not include any added stress due to the coefficient of thermal expansion (CTE) variations or adverse beam formation conditions, and therefore, is expected to have an increased lifetime and performance as compared to metallic beams that have joints.

As used herein, the protecting material may include any material including a metallic phase. In one embodiment, the protecting material includes elemental metals or their alloys. Non-limiting examples of elemental metals include gold, nickel, tin, platinum, silver, and copper. In one embodiment, the protecting material includes alloys of any combination of the aforementioned metallic elements or combinations of these metallic elements with any other metallic elements. In one embodiment, the protecting material has a higher electrical conductivity than the beam material. In one embodiment, the metallic beam material is a nickel tungsten alloy and the protecting material is gold.

In one embodiment, the cantilever beam includes the metallic beam material and the protecting material in a certain weight percentage (Wt %) ratio. In one embodiment, 90 Wt % or more of the cantilever beam includes metallic beam material and the quantity of protecting material present in the cantilever beam is equal to or less than about 10 Wt %. In one embodiment, the protecting material is less than about 5 Wt % of the cantilever beam. In one embodiment, the metallic beam material is encapsulated by the protecting material. As used herein, the "beam material is encapsulated by the protecting material" means that all exposed surfaces of the cantilever beam 120 during release and operation are covered by the protecting material. As used herein, the exposed surfaces are the surfaces that are exposed for any etchant material during the processing or during the formation and operation of the device. The etchant material as used herein may be any gaseous or liquid chemical that is used to etch out any part of the device during preparation of the device.

In one embodiment, the protecting material encapsulates the beam material by forming a coating over the beam material as shown in FIG. 2. In this embodiment, the metallic beam material forms a beam core region 120 and the protecting material forms the coating 128 together to define a coated metallic beam 200. In order to show the coating encapsulation of the metallic beam 120 clearly, a top down cross section of the metallic beam core 120 and coating 128 is shown in FIG. 2. As can be seen from FIG. 2, in one embodiment, the protecting material coating 128 encapsulates the metallic beam 120 at both the anchor region 122 and the free portion 124. In one embodiment, the beam material is encapsulated by a single layer of protecting material. As used herein, the single layer means that the coating 128 is formed by the same protecting material throughout the encapsulation and there is no other material entirely covering the free portion 124 of the cantilever beam 120 within or outside of the protecting material coating 128.

In one embodiment, the coating 128 over the beam core region 120 is a very thin coating. In one embodiment, the coating 128 is less than about a micron thick. In one embodiment, the thickness of the coating 128 is less than about 500 nanometers. In one embodiment, an average thickness of the coating is in a range from about 10 nm to about 200 nm. In one embodiment, the average coating thickness is about 100 nm The coating 128 protects the beam core from any chemical and physical attack and degradation, such as attack from etchants used in the fabrication of device 100. Further, the coating 128 on the beam core region 120 is designed such that the performance of the cantilever beam 120 is not adversely affected by the presence of the coating 128. Therefore, the coating 128 protects the cantilever structure 120 without degrading the normal operation of the beam material at any time of the operation. The thickness and material type of the coating, relative to the core are designed to increase the lifetime, electrical resistance, pull-in voltage, and standoff voltage of the cantilever beam. The amount and type of coating typically depends upon the ability of the beam material to operate despite the presence of the coating.

Figure 3:
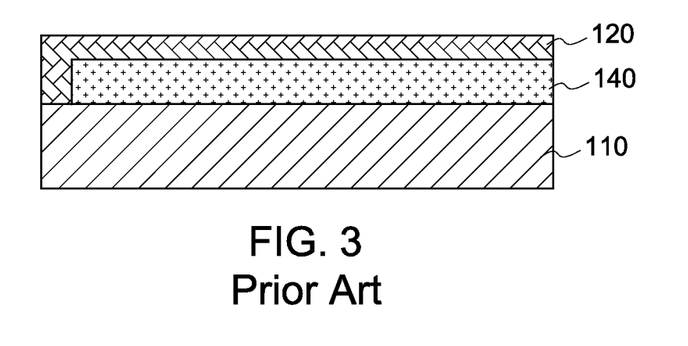
FIG. 3 illustrates a prior art method of preparation of a MEMS device.

FIG. 3 schematically illustrates a prior art method of preparation of a MEMS device 100. The device 100 includes a substrate 110, a beam 120, and a sacrificial layer 140. The beam 120 is typically released by etching out the sacrificial layer 140. The etching process is normally complex as the sacrificial layer 140 needs to be etched in narrow and long channels. During this etching process, the beam 120 material also may be affected and that may result in performance degradation of the cantilever beam 120. For example, a part of the cantilever beam 120 may also get etched during etching of the sacrificial layer 140.

In one embodiment, a method of protecting the cantilever beam during the release and during operation of the device is disclosed. FIG. 4 to FIG. 13 illustrate a cross section of the free portion 124 in a MEMS device during different steps of a method for forming and protecting a cantilever beam 120, according to one example.

Figure 4:
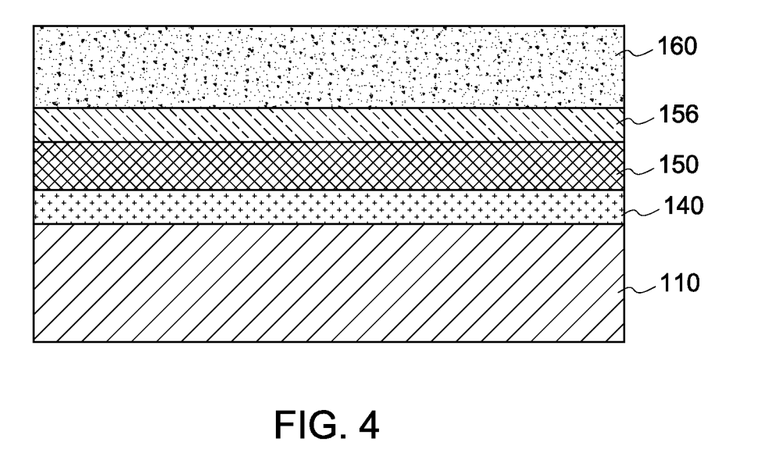
FIG. 4 to FIG. 13 illustrate the tip-end cross section of a MEMS device during different steps of a method of forming, according to an example of the present invention.

FIG. 4 shows a substrate 110 deposited with a sacrificial layer 140, and a first layer 150 of a protecting material deposited over the sacrificial layer 140. The sacrificial layer 140 may include metals, dielectrics, or polymers. The protecting material may be any of the previously described protecting material. A dielectric layer 156 is coated over the first layer 150 of the protecting material. The dielectric layer may be of any material including, but not limited to silicon oxide, silicon nitride, PSG (phospho-silicate-glass) or TEOS (Tetraethyl ortho silicate). Further a photoresist layer 160 is deposited over the dielectric layer 156. The photoresist layer may be made of a positive or negative photoresist. In one embodiment, the photoresist layer 160 is made up of a positive photoresist material.

Figure 5:
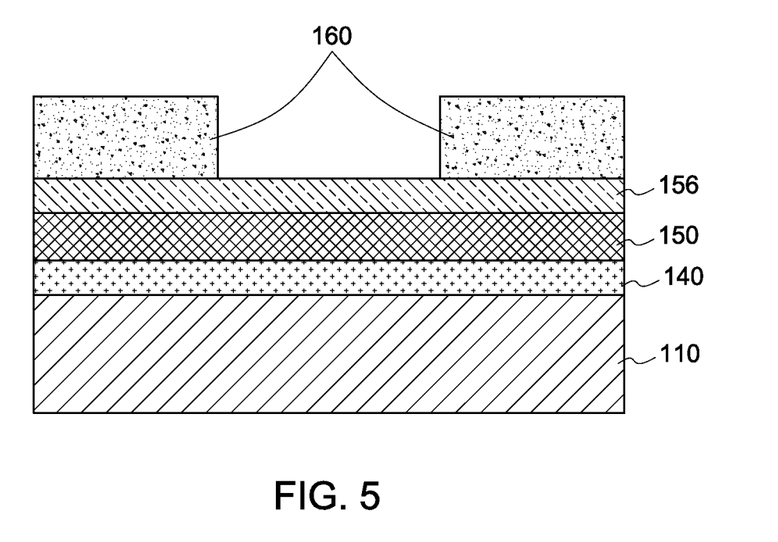
Figure 6:
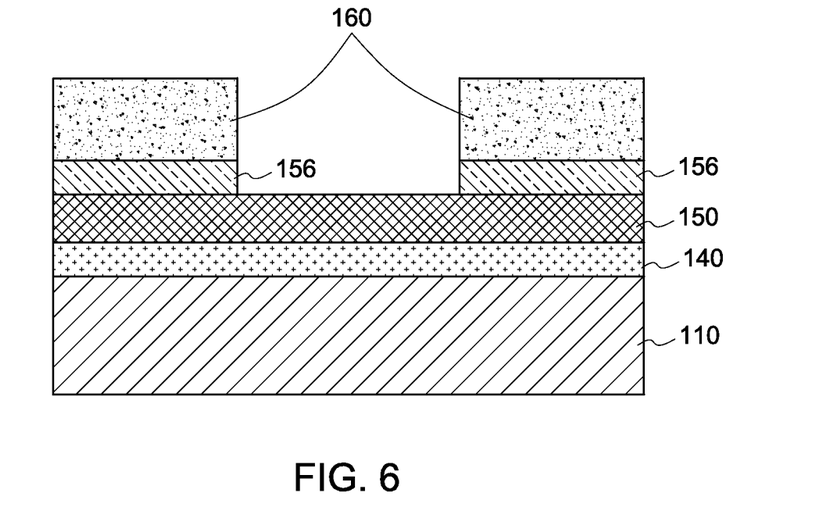
Figure 7:
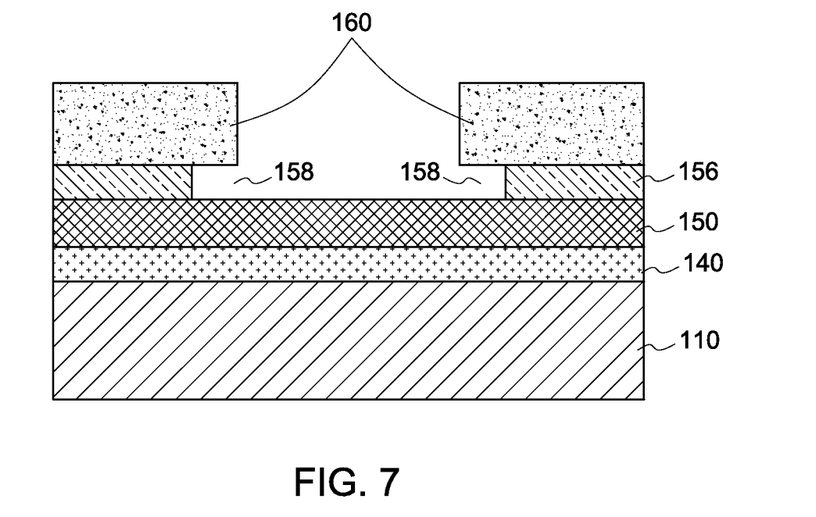

FIG. 5 shows the cross section, where a part of the photoresist layer 160 is patterned so as to make space for the deposition of the beam 120 material. In FIG. 6, a part of the dielectric layer 156 is removed. The part of the dielectric layer 156 may be removed using different methods. In one example method, the part of the dielectric layer 156 is removed by dry etching. This removal of a part of the dielectric layer exposed the first layer 150 of the protecting material. FIG. 7 shows an undercutting of the dielectric layer 156 further to the first removal of the dielectric layer 156. In one example method, the dielectric layer is undercut using a wet etching method. Undercutting the dielectric material layer 140 exposed the first layer 150 of the protecting material even at a place 158 that is partly below the remaining photoresist layer 160.

Figure 8:
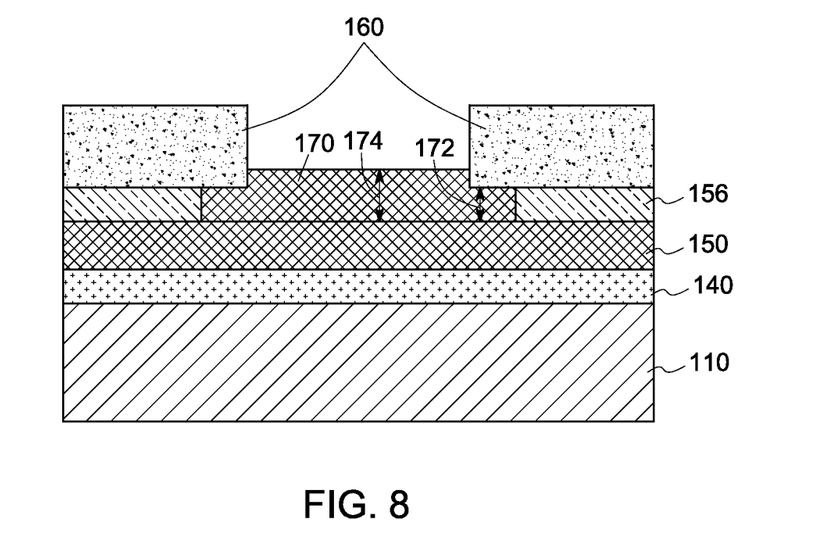

FIG. 8 shows a method step where a second layer 170 of protecting material is deposited over the exposed surface of the first layer 150 of the protecting material including at the place 158 where the first layer 150 of the protecting material is exposed due to the undercutting of the dielectric layer 156. In one embodiment, the protecting material is deposited using an electroplating method. In one embodiment, the second layer 170 of the protecting material is limited to the height 172 of the previously existing dielectric layer 156. In one embodiment, the second layer 170 of the protecting material extended to a height 174 that is more than the height of the previously existing dielectric layer 156. In one embodiment, the protecting material of the second layer 170 is similar to the protecting material of the first layer 150. In one embodiment, the first layer 150 and the second layer 170 were made of different protecting materials. In one particular embodiment, the first layer 150 and the second layer 170 were made of the same protecting material. In one example, both the first layer 150 and the second layer 170 were made of gold.

Figure 9:
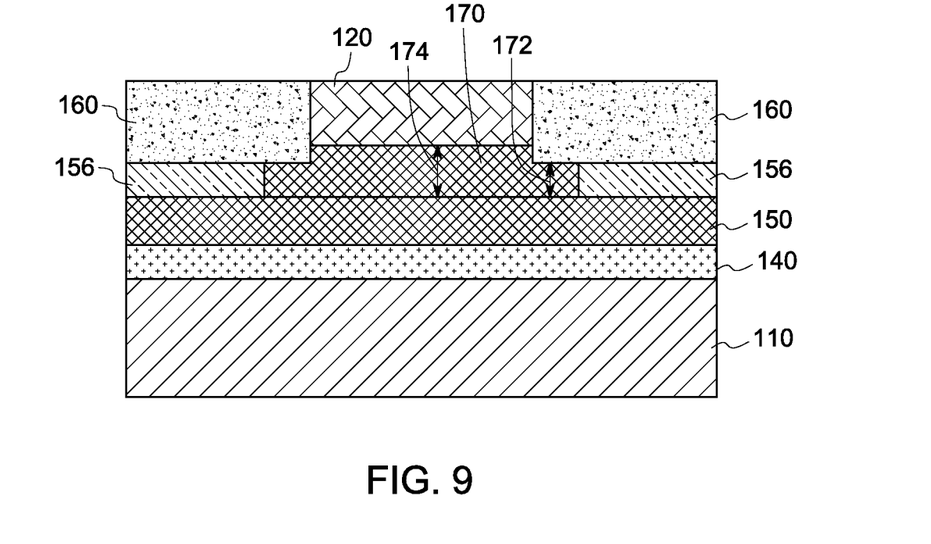
Figure 10:
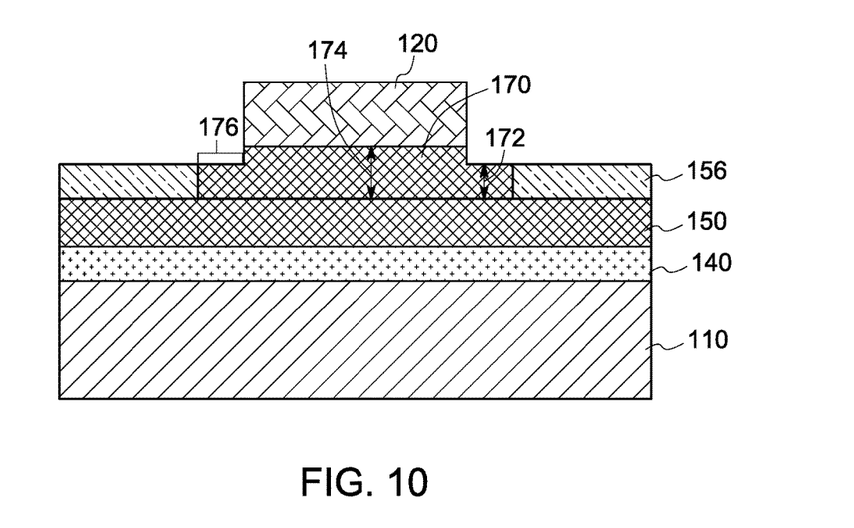

FIG. 9 illustrates a method step where the beam material is deposited to form a beam 120 over the exposed part of the second layer 170. FIG. 10 illustrates the removal of the remaining photoresist layer 160. Removal of the photoresist layer 160 exposed the second layer 170 of the protecting material at the place 158 where the dielectric layer was earlier undercut. This exposure of the second layer forms a lip 176 of the second layer 170 of the protecting material.

Figure 11:
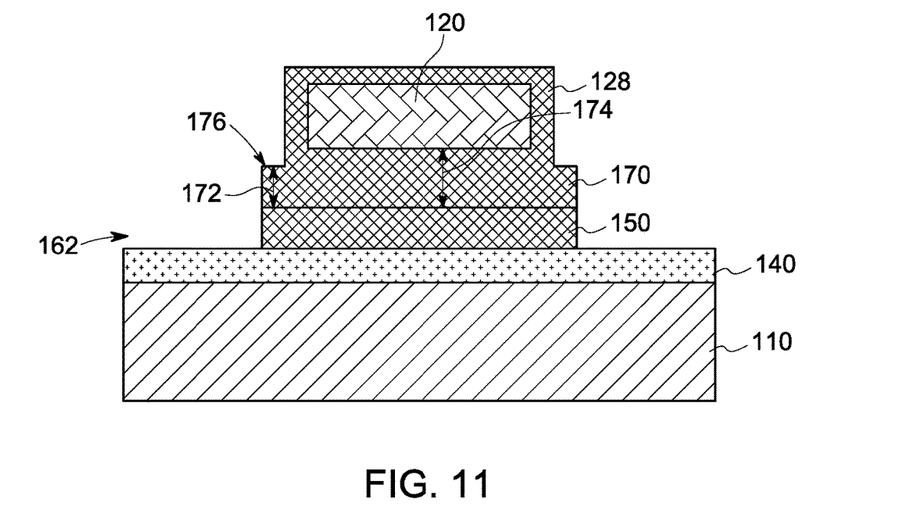

FIG. 11 illustrates the method step where a protecting material is coated as a coating 128 over all the exposed sides of the anchor region 122 and the free portion 124. Further, the remaining part of the dielectric layer 156 and the first layer of protecting material 150 that is present in the extended region 162 were removed. In one embodiment, the deposition of the coating 128 is carried out before the removal of the remaining part of the dielectric layer 156. In an alternate embodiment, the remaining part of the dielectric layer 156 is removed before depositing the coating 128.

Figure 12:
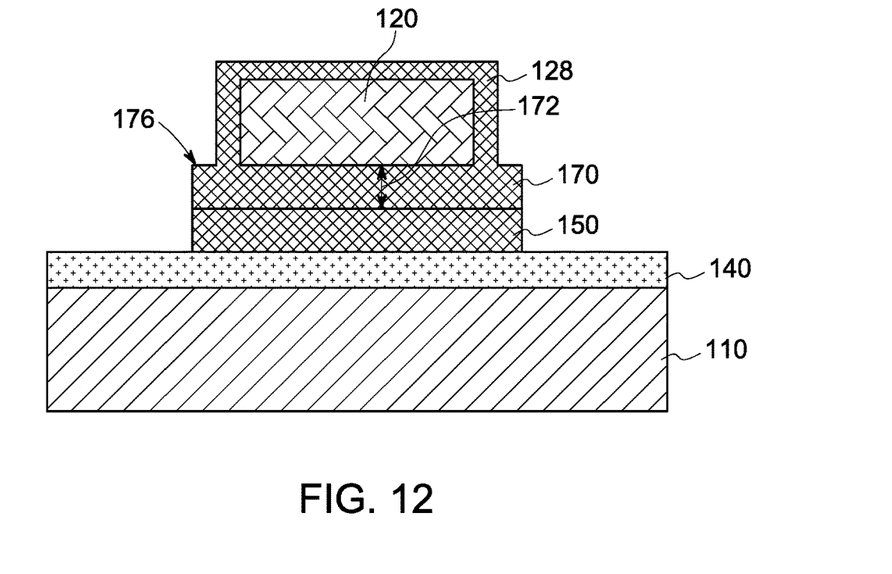

In one embodiment, the protecting material of the coating 128 is the same as that of the second layer 170 of the protecting material. Depending on the height 172 or 174 of the second layer 170 of the protecting material, the coating 128 merges with the second layer 170 at (1) the protecting material at the base of the beam 120 and further with the lip 176 as shown in FIG. 11 or (2) only at the lip 176 as shown in FIG. 12.

Figure 13:
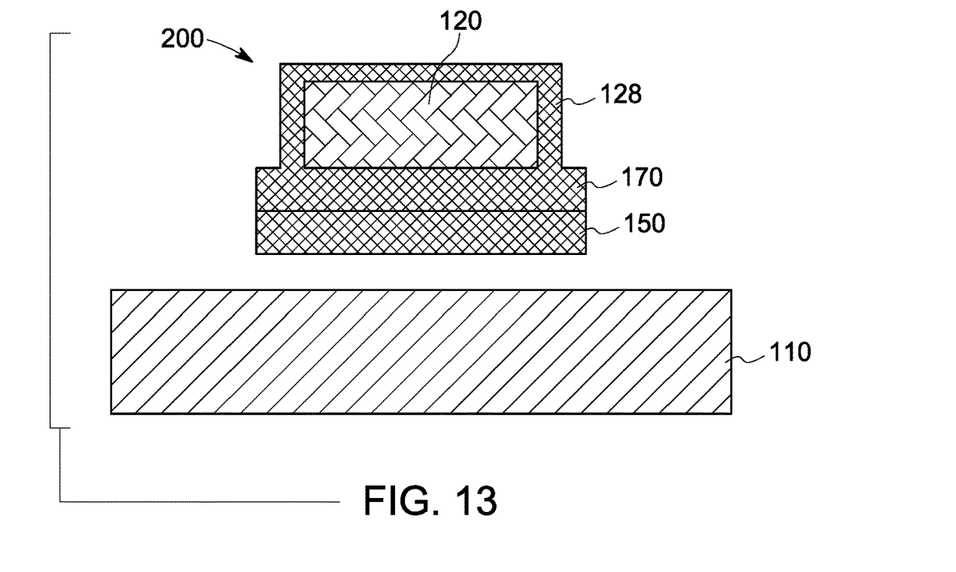

In a further step, the sacrificial layer 140 may be removed to release the coated cantilever beam 200 as shown in FIG. 13. The removal may be by etching the sacrificial layer 140.

In one embodiment, the sacrificial layer 140 is removed completely. In an alternate embodiment, the sacrificial layer 140 is partially removed.

After releasing, the coated cantilever beam 200 included the earlier beam 120, the coating 128, the second layer 170, and the first layer 150 of the protecting material at the base of the cantilever beam 120. Designing the method steps such that the coating 128 of the beam material 120 merges with the second layer 170 provides many advantages. Because of this coating 128 and second layer 170 merging, the beam 120 material is not exposed to any attack and degradation during the etch-out of the dielectric layer 156, etch out of the sacrificial layer 140, or during device operation, thereby preventing device failure by particle generation and/or performance alteration. The beam 120 is encapsulated by the protecting material 128, 170 and therefore, protected from damage in subsequent processing steps and further during operation of the device.

The coating 128 and the first 150 and the second layer 170 of the protecting material may be formed as a very thin coating with respect to the beam 120 so that the design performance of the coated cantilever beam 200 does not differ significantly from what would be expected for an uncoated beam. In one embodiment, the performance degradation of the coated cantilever beam 200 is expected to be less than about 5% of the performance of the uncoated beam 120.

The method steps detailed in FIGS. 4-13 assist in forming the device structure as shown in FIG. 2 earlier. As illustrated in FIG. 2, the illustrated method steps provide a fully encapsulated beam 200, including the coating 128 at the beam anchor region 122 and the beam free portion 124.

While only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A device, comprising:
a metallic beam material comprising a free portion and an anchor region, wherein the free portion is encapsulated by a single layer of protecting material, wherein the single layer of protecting material comprises a lip at the free portion of the metallic beam material, and wherein the protecting material comprises elemental metals, alloys, or combination of elemental metals and alloys.

2. The device of claim 1, wherein the metallic beam material is in a monolithic form.

3. The device of claim 1, wherein the anchor region of the metallic beam material is encapsulated by the protecting material.

4. The device of claim 1, wherein the protecting material has a higher electrical conductivity than the metallic beam material.

5. The device of claim 1, wherein the metallic beam material comprises nickel, tin, platinum, silver, copper, gold, nickel tungsten alloy, nickel iron alloy, or any combinations of the foregoing.

6. The device of claim 1, wherein the protecting material comprises gold, nickel, tin, platinum, silver, copper, or any combinations of the foregoing.

7. The device of claim 1, wherein the metallic beam material is a nickel tungsten alloy and the protecting material is gold.

8. The device of claim 1, wherein the metallic beam material forms a core region of a coated cantilever beam.

9. The device of claim 8, wherein the protecting material forms a coating of the coated cantilever beam.

10. The device of claim 9, wherein the coating has a thickness less than about a micron.

11. The device of claim 9, wherein the coated cantilever beam comprises at least about 90 Wt% of the metallic beam material, and 10 Wt% or less of the protecting material.

12. A device, comprising:
  a coated cantilever beam comprising:
    a monolithic core region of a metallic beam material comprising nickel tungsten alloy, wherein the monolithic core region comprises a free portion and an anchor region; and
    a single layer coating of a protecting material comprising gold, wherein the free portion of the monolithic core region is encapsulated by the coating, and wherein the single layer coating of the protecting material comprises a lip at the free portion of the monolithic core region.

13. The device of claim 12, wherein the anchor region is encapsulated by the protecting material.

14. The device of claim 12, wherein the protecting material has a higher electrical conductivity than the metallic beam material.

15. The device of claim 12, wherein the metallic beam material is a nickel tungsten alloy and the protecting material is gold.

* * * * *